United States Patent [19]
Choi et al.

[11] Patent Number: 5,677,873
[45] Date of Patent: Oct. 14, 1997

[54] METHODS OF PROGRAMMING FLASH EEPROM INTEGRATED CIRCUIT MEMORY DEVICES TO PREVENT INADVERTENT PROGRAMMING OF NONDESIGNATED NAND MEMORY CELLS THEREIN

[75] Inventors: Byeng-Sun Choi, Kyungki-do; Tae-Sung Jung, Seoul, both of Rep. of Korea

[73] Assignee: Samsung Electronics Co., Ltd., Suwon, Rep. of Korea

[21] Appl. No.: 716,022

[22] Filed: Sep. 19, 1996

[30] Foreign Application Priority Data

Sep. 19, 1995 [KR] Rep. of Korea .................. 30747/1995

[51] Int. Cl.⁶ ............................................. G11C 11/34
[52] U.S. Cl. ........................... 365/185.17; 365/185.26
[58] Field of Search ........................................ 365/185.17

[56] References Cited

U.S. PATENT DOCUMENTS

| | | | |
|---|---|---|---|
| 5,473,563 | 12/1995 | Suh et al. | 365/185 |
| 5,568,420 | 10/1996 | Lim et al. | 326/185.17 |
| 5,570,315 | 10/1996 | Tanaka et al. | 365/185.17 |

OTHER PUBLICATIONS

B. Prince et al., *Semiconductor Memories, A Handbook of Designs Manufacture and Application*, Second Edition, John Wiley & Sons Ltd., pp. 185–187 and 603–604, 1991.

*Primary Examiner*—David C. Nelms
*Assistant Examiner*—Michael T. Tran
*Attorney, Agent, or Firm*—Bell, Seltzer, Park & Gibson

[57] ABSTRACT

Methods of programming flash EEPROM integrated circuit memory devices containing an array of NAND cells therein include the steps of applying a preselected logic signal to a select transistor of a NAND memory cell to inhibit the likelihood of inadvertent programming thereof when adjacent cells are being programmed. According to one embodiment, a first logic signal having a first non-zero potential ($V_{fp}$) is applied to a bit line BL of a first NAND memory cell in the array. Then, at commencement of a first time interval (TI), a second logic signal having a second potential which is greater than the first potential is applied to the gate (SSL) of the first select transistor ST1 to thereby turn-on the first select transistor "hard" and drive the potential of a source (S) thereof towards the potential of the bit line (i.e., $V_{fp}$). Here, the first potential $V_{fp}$ is preferably selected to be higher than the power supply voltage VCC. Then, upon termination of the first time interval TI, the potential of the second bilevel logic signal is reduced from the second potential to the first potential $V_{fp}$ (or ground GND) to thereby limit conduction across the channel of the first select transistor ST1 and electrically isolate the bit line BL from the source, drain and channel regions of the EEPROM transistors in the first NAND memory cell. Preferably following termination of the first time interval, a pass logic signal having a pass potential ($V_{pass}$) and a program logic signal having a program potential ($V_{pgm}$) (where $V_{pgm}>V_{pass}$) are applied to the gates of a plurality of unselected EEPROM transistors and the gate of a "selected" EEPROM transistor in the first NAND memory cell.

20 Claims, 2 Drawing Sheets

5,677,873

METHODS OF PROGRAMMING FLASH EEPROM INTEGRATED CIRCUIT MEMORY DEVICES TO PREVENT INADVERTENT PROGRAMMING OF NONDESIGNATED NAND MEMORY CELLS THEREIN

FIELD OF THE INVENTION

The present invention relates to integrated circuit memory devices, and more particularly to methods of programming integrated circuit memory devices.

BACKGROUND OF THE INVENTION

Semiconductor memory devices for storing data can typically be categorized as either volatile memory devices or nonvolatile memory devices. Volatile memory devices lose their stored data when their power supplies are interrupted, however nonvolatile memory devices retain their stored data even when their power supplies are interrupted. Thus, nonvolatile memory devices are widely used in applications where the possibility of power supply interruption is present.

Conventional nonvolatile memory devices include a type of electrically erasable programmable read only memory (EEPROM) device typically referred to as a flash EEPROM device. Flash EEPROM devices typically include a semiconductor substrate of first conductivity type (e.g., P-type), spaced source and drain regions of second conductivity type (e.g., N-type) in the substrate, a channel region at a face of the substrate, between the spaced source and drain regions, a floating gate for storing charge carriers when the device is programmed and a control gate which overlies the floating gate, opposite the channel region. Operation of a flash EEPROM device is typically divided into three modes including programming, erasing and reading.

Programming of a flash EEPROM device is typically achieved by biasing the drain region to a first positive bias, relative to the source region, and biasing the control gate to a second positive bias which is greater than the first positive bias. In the absence of any stored charge on the floating gate, these biases cause the formation of an inversion-layer channel of electrons at the face of the substrate, between the source and drain regions. As will be understood by those skilled in the art, the drain-to-source voltage accelerates these electrons through the channel to the drain region where they acquire sufficiently large kinetic energy and are typically referred to as "hot" electrons. The larger positive bias on the control gate also establishes an electrical field in a tunneling oxide layer which separates the floating gate from the channel region. This electric field attracts the hot electrons and accelerates them toward the floating gate, which is disposed between the control gate and the channel region, by a process known as tunneling. The floating gate then accumulates and traps the accumulated charge. Fortunately, the process of charging the floating gate is self-limiting. The negative charge that accumulates on the floating gate reduces the strength of the electric field in the tunneling oxide layer to the point where it is no longer capable of accelerating "hot" electrons from the drain side of the channel region.

As will be understood by those skilled in the art, the accumulation of a large quantity of trapped charge (electrons) on the floating gate will cause the effective threshold voltage ($V_{th}$) of the field effect transistor comprising the source region, drain region, channel region and control gate to increase. If this increase is sufficiently large, the field effect transistor will remain in a nonconductive "off" state when a predetermined "read" voltage is applied to the control gate during a read operation (i.e., $V_{th} > V_{read}$). In this state, known as the programmed state, the EEPROM device may be said to be storing a logic 0. Once programmed, the EEPROM device retains its higher threshold voltage even when its power supply is interrupted or turned off for long periods of time.

Reading of the EEPROM device is achieved by applying a predetermined read voltage ($V_{read}$) to the control gate, typically via a word line connecting a row of identical EEPROM devices or "cells", and applying a positive bias to the drain region, typically via a bit line connecting a column of identical EEPROM cells. If the EEPROM device is programmed, it will not conduct drain current ($I_{ds}$). However, if the EEPROM device has not been programmed (or has been erased), it will heavily conduct. In this state, the EEPROM device may be said to be storing a logic 1. Thus, by monitoring the bit line current, the programmed state (i.e., 1 or 0) of the EEPROM device can be determined.

Erasing of the EEPROM device may also be achieved by removing the stored charge from the floating gate. The erasure process can be achieved, for example, by grounding the control gate and applying a positive bias to the substrate (e.g., 10-20 Volts). Accordingly, flash EEPROM devices typically require bulk erasure of large portions of an array of cells since the effects of applying a large substrate bias typically cannot be confined to a single EEPROM cell.

As will be understood by those skilled in the art, a flash EEPROM integrated circuit memory device may contain a column-by-column array of NAND EEPROM cells having the general construction illustrated in cross-section and schematically by FIGS. 11.58 and 11.59 from a handbook by B. Prince et al. entitled *Semiconductor Memories*, John Wiley & Sons Ltd., pp. 603–604 (1991); and in an article by M. Momodomi et al. entitled *An Experimental 4-Mbit CMOS EEPROM with an NAND Structured Cell*, IEEE Journal of Solid State Circuits, Vol. 24, No. 5, p. 1238 October (1989). FIG. 1 herein also illustrates a similar NAND EEPROM cell containing first and second select transistors ST1 and ST2, respectively, and a column or string of eight (8) flash EEPROM unit cells (M1-M8) connected in series between the first and second select transistors. The operation of the NAND EEPROM cell of FIG. 1 is more fully described in commonly assigned U.S. Pat. No. 5,473, 563 to Suh et al. entitled *Nonvolatile Semiconductor Memory*, the disclosure of which is hereby incorporated herein by reference.

As illustrated, the NAND EEPROM cell of FIG. 1 comprises a first string select transistor ST1 having a drain connected to a corresponding one of a plurality of bit lines BL in an integrated circuit memory device. The source (S) of the first string select transistor ST1 is also connected to a drain of a first EEPROM transistor M1 in a string of eight transistors M1-M8. A second select transistor ST2 is also electrically connected in series between the source of the eighth EEPROM transistor M8 and ground (GND) or a common signal line (not shown) which is typically connected to the second select transistor ST2 of each of the NAND memory cells in the array. Each bit line BL may also be electrically connected to a page buffer and latch L1 therein by a bit line pass transistor T1, as will be understood by those skilled in the art.

To program an EEPROM transistor within a NAND cell, a number of programming steps are typically performed as now described. For example, the bit line BL of the NAND cell is typically held a ground potential (logic 0) by electrically connecting the bit line BL to the output node N1 of the page buffer latch L1. This is preferably achieved by setting the gate SBL of the bit line pass transistor T1 and the input node N2 of the latch L1 to a logic 1 potential which may be the power supply voltage (e.g., VCC) or higher. The gate GSL of the second select transistor ST2 is also set to logic 0 potential to maintain the second select transistor ST2 in a nonconductive (i.e., "off") state. The first select transistor ST1 is also turned-on by setting the gate SSL thereof to a logic 1 potential. This electrically connects the source (S) of the first select transistor ST1 to the bit line BL which is at ground potential. The gate (e.g., WL6) of an EEPROM transistor (e.g., M7) to be programmed is also set to a sufficiently high program voltage (e.g., $V_{pgm}$=18V) to cause Fowler-Nordheim tunneling of hot electrons from the drain side of its respective channel into its respective floating gate, as described more fully hereinabove. These electrons are provided by the bit line B2 by setting the gates (e.g., WL0–5 and WL7) of the EEPROM transistors which are not being programmed to sufficiently high pass voltages (e.g., $V_{pass}$= 10 V) to render these transistors conductive (i.e., "on") regardless of their programmed state (i.e., threshold voltage).

However, because programming of the EEPROM transistors in adjacent NAND EEPROM cells (not shown) in the array must be performed without altering the already programmed states of the EEPROM transistors in the illustrated NAND memory cell, steps must taken to prevent inadvertent programming of the transistors in the illustrated NAND memory cell. To prevent such inadvertent programming, two conventional programming methodologies have been used. According to a first methodology, the bit line BL is set to a relatively high logic 1 potential (which is typically significantly greater than the power supply voltage VCC) and the first select transistor ST1 is turned on "hard" by applying a relatively large potential bias to its gate SSL. As will be understood by those skilled in the art, this sequence of steps drives the source (S) of the first select transistor ST1 to the potential of the bit line BL and also drives the source, drain and channel regions of the EEPROM transistors M1–M8 towards the potential of the source of the first select transistor ST1. Accordingly, if the potential of the bit line BL is sufficiently high, the occurrence of inadvertent programming caused by Fowler-Nordheim tunneling can be prevented even though the gates of the EEPROM transistors (i.e., word lines WL0–WL7) of FIG. 1 are being held at respective pass and program potentials (e.g., 10 or 18 V) during programming of an adjacent NAND memory cell (not shown). Yet, because this methodology requires the generation of a high bit line potential using relatively large high voltage latch transistors and associated structures, it is typically not preferred.

According to a second conventional methodology, the bit line BL and the gate SSL of the first select transistor ST1 are set to the power supply voltage VCC. As will be understood by those skilled in the art, this sequence of steps drives the source of the first select transistor ST1 to a potential of about VCC-$V_{th}$, where "$V_{th}$" is the threshold voltage of the first select transistor ST1. However, once the source of the first select transistor ST1 reaches a potential of about VCC-$V_{th}$, the first select transistor ST1 turns off. When this occurs, the source, drain and channel regions of the EEPROM transistors M1–M8 become electrically disconnected from the bit line BL and enter a "floating" state. Moreover, because the source, drain and channel regions of the EEPROM transistors M1–M8 are capacitively coupled to their respective control gates WL0–WL7, the application of respective pass and program potentials (e.g., $V_{pass}$=10 V and $V_{pgm}$=18 V) to the control gates will cause the potentials of the source, drain and channel regions to be increased or "boosted" by an amount equal to "$V_{boost}$". This boosting effect prevents the full gate potential of $V_{pgm}$ or $V_{pass}$ from being established between the control gate and channel region of the EEPROM transistors M1–M8 and thereby inhibits the likelihood of inadvertent programming caused by Fowler-Nordheim tunneling of "hot" electrons into the floating gates of the EEPROM transistors M1–M8.

As will be understood by those skilled in the art, the magnitude of "$V_{boost}$" depends on, among other things, the degree of capacitive coupling and the magnitude of the pass and program potentials. In particular, due to capacitive coupling and charge sharing between the source of the first select transistor ST1 and the source, drain and channel regions of the eight EEPROM transistors M1–M8, the potentials of the source, drain and channel regions ("$V_{sdc}$") are typically increased to a level of about $V_{sdc} \approx V_{boost}$+ (VCC-$V_{th}$)/9. Thus, to prevent inadvertent programming, the magnitude of the difference between $V_{pgm}$ and $V_{sdc}$ must be sufficiently low to prevent Fowler-Nordheim tunneling. But, because $V_{sdc}$ is reduced as the power supply voltage VCC is reduced, inadvertent programming may occur in integrated circuit memory devices having low power supply voltages.

Thus, notwithstanding the above described conventional methodologies for programming NAND EEPROM cells, as illustrated by FIG. 1, there continues to be a need for improved programming methodologies which do not require the presence of large high voltage transistors and are not susceptible to inadvertent programming at low power supply voltages.

SUMMARY OF THE INVENTION

It is therefore an object of the present invention to provide improved methods of programming integrated circuit memory devices.

It is another object of the present invention to provide methods of programming integrated circuit memory devices which are less susceptible to inadvertent programming.

These and other objects, features and advantages of the present invention are provided by methods of programming integrated circuit memory devices, such as flash EEPROM integrated circuit memory devices which contain a columnar array of NAND memory cells therein, by applying a bilevel control signal to a select transistor of a NAND memory cell to inhibit the likelihood of inadvertent programming thereof when adjacent cells are being programmed. In particular, a preferred method includes the steps of applying a first logic signal having a first non-zero potential ($V_{fp}$) to a bit line BL of a first NAND memory cell in the array. Then, at commencement of a first time interval (TI), a second bilevel logic signal having a second potential which is greater than the first potential is applied to the gate (SSL) of the first select transistor ST1 to thereby turn-on the first select transistor "hard" and drive the potential of a source (S) thereof towards the potential of the bit line (i.e., $V_{fp}$).

Here, the first potential $V_{fp}$ is preferably selected to be higher than the power supply voltage VCC, but not so high as to require bit line driving transistors of large area as described above with respect to the first conventional programming methodology. In addition, the duration of the first time interval TI should be long enough so that the potential of the source of the first select transistor ST1 is able to level off at the potential of the bit line (i.e., $V_{fp}$). Then, upon termination of the first time interval TI, the potential of the second bilevel logic signal is reduced from the second potential to the first potential $V_{fp}$ to thereby limit conduction across the channel of the first select transistor ST1 and electrically isolate the bit line BL from the source, drain and channel regions of the EEPROM transistors in the first NAND memory cell. Preferably following termination of the first time interval, a pass logic signal having a pass potential ($v_{pass}$) and a program logic signal having a program potential ($V_{pgm}$) (where $V_{pgm} > V_{pass}$) are applied to the gates of a plurality of unselected EEPROM transistors and the gate of a "selected" EEPROM transistor in the first NAND memory cell. Here, the term "selected" is used to identify the EEPROM transistor having a word line WL in common with the word line of a transistor of an adjacent NAND memory cell array which is being programmed.

These steps of limiting conduction across the first select transistor ST1 after its source has been fully charged to the bit line potential (i.e., $V_{fp}$) and then applying the pass and program logic signals are preferably performed so that the capacitively coupled source, drain and channel regions of the EEPROM transistors (e.g., M1–M8) are "boosted" from starting potentials (i.e., $V_{fp}/9$) which are greater than the starting potentials (i.e., $(VCC-V_{th})/9$) associated with the second conventional programming methodology described above. Accordingly, because the starting potentials are greater, the final potentials to which the source, drain and channel regions are "boosted" to because, of capacitive coupling are also greater so the possibility of inadvertent programming through Fowler-Nordheim tunneling of "hot" electrons is reduced.

DESCRIPTION OF PREFERRED EMBODIMENTS

The present invention will now be described more fully hereinafter with reference to the accompanying drawings, in which preferred embodiments of the invention are shown. This invention may, however, be embodied in different forms and should not be construed as limited to the embodiments set forth herein. Rather, these embodiments are provided so that this disclosure will be thorough and complete, and will fully convey the scope of the invention to those skilled in the art. The phrases "greater than" and "less than" are used in an absolute sense where, for example, +5>+4 and –5>4.

Figure 1:
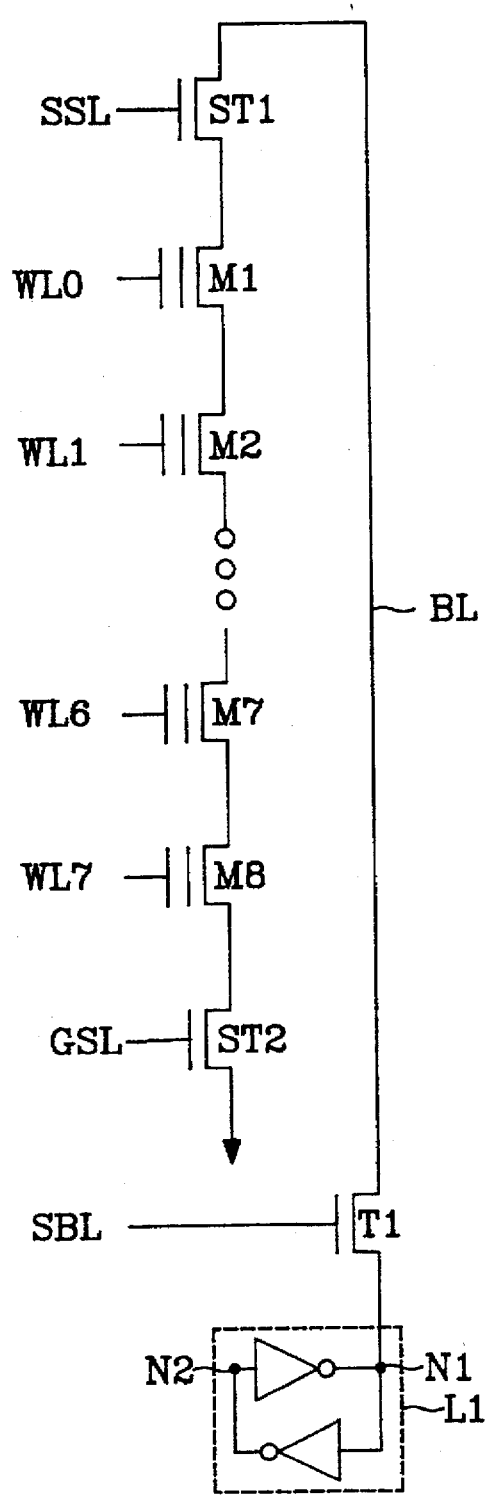
FIG. 1 illustrates a NAND memory cell containing eight flash EEPROM transistors therein and associated buffer latch, according to the prior art.
Figure 2:
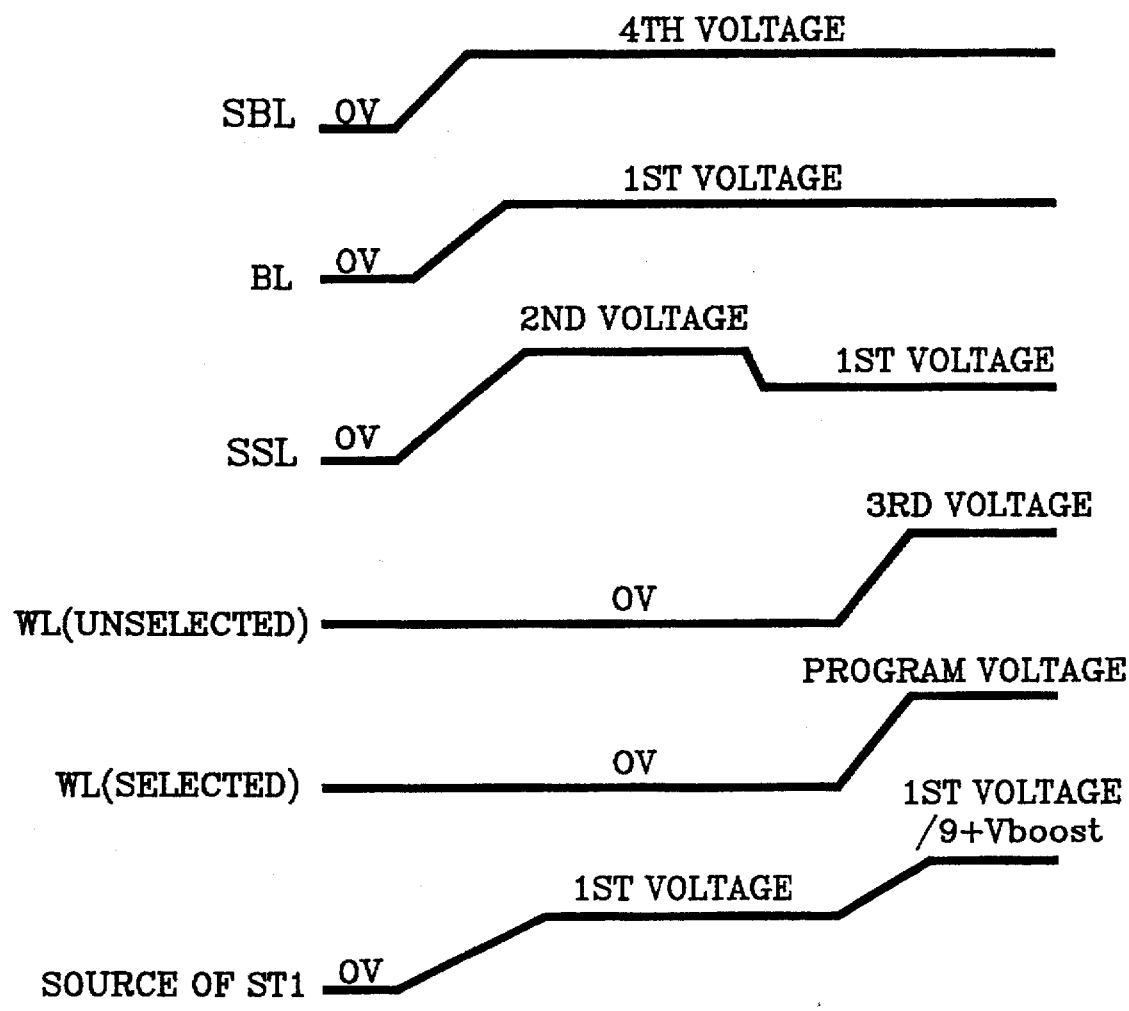
FIG. 2 is a diagram illustrating the timing of signals for preventing inadvertent programming of the NAND memory cell of FIG. 1, according to the present invention.

Referring now to FIG. 2, a preferred method of operating the NAND memory cell of FIG. 1 to prevent inadvertent programming will now be described. The preferred method includes the steps of applying a first logic signal having a first non-zero potential (e.g., $V_{fp}$=about 4.5 V, which is shown as 1st voltage) to a bit line BL of a first NAND memory cell in the array. This step may be performed by turning a bit line pass transistor T1 on hard by biasing the gate thereof at a relatively high potential (shown as 4th voltage) and setting the output of a latch L1 to the first potential $V_{fp}$. Then, at commencement of a first time interval (TI), a second bilevel logic signal (shown as SSL) having a second potential (e.g., about 6 V, which is shown as 2nd voltage) which is greater than the first potential is applied to the gate of the first select transistor ST1 to thereby turn-on the first select transistor "hard" and drive the potential of a source (S) thereof towards the potential of the bit line (i.e., $V_{fp}$).

Here, the first potential $V_{fp}$ is preferably selected to be higher than the power supply voltage VCC, but not so high as to require bit line driving transistors of large area. In addition, the duration of the first time interval TI should be long enough so that the potential of the source of the first select transistor ST1 is able to level off at the potential of the bit line (i.e., $V_{fp}$). Then, upon termination of the first time interval TI, the potential of the second bilevel logic signal SSL is reduced from the second potential to the first potential $V_{fp}$ to thereby limit conduction across the channel of the first select transistor ST1 and electrically isolate the bit line BL from the source, drain and channel regions of the EEPROM transistors in the illustrated NAND memory cell. Preferably following termination of the first time interval, a pass logic signal having a pass potential (e.g., $V_{pass}$=10 V, shown as 3rd voltage) and a program logic signal having a program potential (e.g., $V_{pgm}$=18 V, shown as program voltage) (which is greater than the pass potential) are applied to the gates (WL) of a plurality of unselected EEPROM transistors and the gate (WL) of a "selected" EEPROM transistor in the first NAND memory cell. Here, the term "selected" is used to identify the EEPROM transistor having a word line WL in common with the word line of a transistor of an adjacent NAND memory cell array being selected for programming.

These steps of limiting conduction across the channel of the first select transistor ST1 after its source has been fully charged to the bit line potential (i.e., $V_{fp}$) and then applying the pass and program logic signals are preferably performed so that the capacitively coupled source, drain and channel regions of the EEPROM transistors (e.g., M1–M8) are "boosted" from relatively large starting potentials (i.e., $V_{fp}/9$) which are greater than the starting potentials associated with the above described second conventional programming methodology (e.g., $(VCC-V_{th})/9$). Accordingly, because the starting potentials are greater, the final potentials to which the source, drain and channel regions are "boosted" to because of capacitive coupling are also greater (e.g., $V_{fp}/9 + V_{boost}$). Thus, the possibility of inadvertent programming through Fowler-Nordheim tunneling of "hot" electrons in the floating gates of the EEPROM transistors is reduced.

In the drawings and specification, there have been disclosed typical preferred embodiments of the invention and, although specific terms are employed, they are used in a generic and descriptive sense only and not for purposes of limitation, the scope of the invention being set forth in the following claims.

That which is claimed is:

1. A method of programming a flash EEPROM integrated circuit memory device containing an array of NAND memory cells therein, comprising the steps of:

applying a first logic signal having a first non-zero potential to a bit line of a first NAND memory cell in the array;

applying, at commencement of a first time interval, a second logic signal having a second non-zero potential which is greater than the first potential, to a first select transistor of the first NAND memory cell to thereby turn-on the first select transistor and drive the potential of a source thereof to the first potential;

reducing the potential of the second logic signal from the second potential to about the first potential upon termination of the first time interval; and then applying a pass logic signal having a non-zero pass potential and a program logic signal having a non-zero program potential which is greater than the pass potential to a plurality of unselected EEPROM transistors and at least one selected EEPROM transistor, respectively, in the first NAND memory cell.

2. The method of claim 1, wherein said reducing step comprises reducing the potential of the second logic signal to thereby limit conduction across a channel of the first select transistor and electrically isolate the bit line from the selected and unselected EEPROM transistors in the first NAND memory cell.

3. The method of claim 2, wherein said step of applying pass and program logic signals comprises the step of boosting the potential of the source of the first select transistor to a potential greater than the first potential.

4. The method of claim 3, wherein said step of applying a pass logic signal to a plurality of unselected EEPROM transistors in the first NAND memory cell comprises the step of driving control gates of the unselected EEPROM transistors from respective potentials less than the first potential to the pass potential.

5. The method of claim 4, wherein said step of driving the control gates of the unselected EEPROM transistors is commenced after commencement of the first time interval.

6. The method of claim 5, wherein said step of driving the control gates of the unselected EEPROM transistors is commenced after termination of the first time interval.

7. The method of claim 6, wherein said step of applying a program logic signal to at least one selected EEPROM transistor in the first NAND memory cell comprises the step of driving a control gate of the at least one selected EEPROM transistor from a potential less than the first potential to the program potential.

8. The method of claim 7, wherein said step of driving the control gate of the at least one selected EEPROM transistor is commenced after commencement of the first time interval.

9. The method of claim 8, wherein said step of driving the control gate of the at least one selected EEPROM transistor is commenced after termination of the first time interval.

10. The method of claim 9, wherein said boosting step comprises boosting the potential of the source of the first select transistor to a potential greater than the pass potential after termination of the first time interval.

11. The method of claim 1, wherein the flash EEPROM integrated circuit memory device is powered at a predetermined supply potential; and wherein said step of applying a first logic signal comprises applying a first logic signal having a first potential greater than the supply potential to a bit line of a first NAND memory cell in the array.

12. The method of claim 10, wherein the flash EEPROM integrated circuit memory device is powered at a predetermined supply potential; and wherein said step of applying a first logic signal comprises applying a first logic signal having a first potential greater than the supply potential to a bit line of a first NAND memory cell in the array.

13. A method of programming a flash EEPROM integrated circuit memory device containing an array of NAND memory cells therein, comprising the steps of:

applying a first logic signal having a first non-zero potential to a bit line of a first NAND memory cell in the array;

applying, at commencement of a first time interval, a second logic signal having a second non-zero potential which is greater than the first potential, to a first select transistor of the first NAND memory cell to thereby turn-on the first select transistor and drive the potential of a source thereof to the first potential;

reducing the potential of the second logic signal from the second potential to a level below the first potential upon termination of the first time interval to thereby turn-off the first select transistor; and then applying a pass logic signal having a non-zero pass potential and a program logic signal having a non-zero program potential which is greater than the pass potential to a plurality of unselected EEPROM transistors and at least one selected EEPROM transistor, respectively, in the first NAND memory cell.

14. The method of claim 13, wherein said step of applying pass and program logic signals comprises the step of boosting the potential of the source of the first select transistor to a potential greater than the first potential.

15. The method of claim 14, wherein said step of applying a pass logic signal to a plurality of unselected EEPROM transistors in the first NAND memory cell comprises the step of driving control gates of the unselected EEPROM transistors from respective potentials less than the first potential to the pass potential.

16. The method of claim 15, wherein said step of driving the control gates of the unselected EEPROM transistors is commenced after commencement of the first time interval.

17. The method of claim 16, wherein said step of driving the control gates of the unselected EEPROM transistors is commenced after termination of the first time interval.

18. The method of claim 17, wherein said step of applying a program logic signal to at least one selected EEPROM transistor in the first NAND memory cell comprises the step of driving a control gate of the at least one selected EEPROM transistor from a potential less than the first potential to the program potential.

19. The method of claim 18, wherein said step of driving the control gate of the at least one selected EEPROM transistor is commenced after commencement of the first time interval.

20. The method of claim 19, wherein said step of driving the control gate of the at least one selected EEPROM transistor is commenced after termination of the first time interval.

* * * * *